United States Patent [19]

Kashihara et al.

[11] Patent Number: 4,516,673

[45] Date of Patent: May 14, 1985

[54] APPARATUS FOR CONVEYING A LEAD FRAME MOUNTING SEMICONDUCTOR PELLETS

[75] Inventors: Tomio Kashihara, Yokohama; Toshiro Tsuruta; Masayoshi Yamaguchi, both of Kawasaki; Kiyotachi Yokoi, Yokohama; Etsuji Suzuki, Tokyo, all of Japan

[73] Assignee: Tokyo Shibaura Denki Kabushiki Kaisha, Japan

[21] Appl. No.: 426,754

[22] Filed: Sep. 29, 1982

[30] Foreign Application Priority Data

Nov. 25, 1981 [JP] Japan .................................. 56-188839

[51] Int. Cl.³ .............................................. B65G 43/00
[52] U.S. Cl. .................................... 198/341; 198/345; 198/740; 226/67; 226/141; 228/4.5; 29/759; 29/827
[58] Field of Search ............... 198/341, 345, 740, 741, 198/859; 228/4.5, 6 A; 29/759, 827; 226/8, 65, 67, 138, 141, 158; 414/750

[56] References Cited

U.S. PATENT DOCUMENTS

| 2,001,520 | 5/1935 | Carlson | 226/67 |
| 2,817,515 | 12/1957 | Przysiecki | 226/67 |
| 3,958,682 | 5/1976 | Martin | 198/341 |
| 4,347,964 | 9/1982 | Takasugi et al. | 228/4.5 |

FOREIGN PATENT DOCUMENTS 55-88351 7/1980 Japan .................................. 228/4.5

Primary Examiner—Joseph E. Valenza
Attorney, Agent, or Firm—Cushman, Darby & Cushman

[57] ABSTRACT

An apparatus for conveying a lead frame mounting semiconductor pellets comprises a guide path for guiding the lead frame, and a feed member. The feed member is moved by a solenoid mechanism from a first position where the feed member is separated from the lead frame to a second position where the feed member engages with the lead frame. The feed member positioned in the second position is moved by a X-Y table from an initial position to a forward position along the guide path, whereby the lead frame is conveyed along the guide path by a predetermined distance.

14 Claims, 4 Drawing Figures

APPARATUS FOR CONVEYING A LEAD FRAME MOUNTING SEMICONDUCTOR PELLETS

BACKGROUND OF THE INVENTION

The present invention relates to an apparatus for conveying a lead frame mounting a number of semiconductor pellets thereon, in wire bonding.

In a wire bonding system, the lead frame on which the semiconductor pellets are mounted is intermittently conveyed by an apparatus for conveying lead frame at a predetermined feed pitch. The portion to be bonded of the lead frame and the portion to be bonded of the semiconductor pellet are guided to a predetermined position corresponding to a bonding tool of a bonding head placed on an X-Y table. Since the semiconductor pellet is very small and wire bonding requires a high precision of processing, the apparatus requires very high precision of conveying.

Generally, the lead frame conveying apparatus has a guide path for guiding the lead frame and a feed rod disposed along the guide path. The feed rod has an engaging portion which can be engaged with the lead frame. The feed rod is disposed to reciprocate along the guide path and is vertically movable between a position where the engaging portion of the feed rod engages with the lead frame and a position where the engaging portion becomes disengaged therefrom. The feed rod is intermittently driven by a driving means. The driving means has a motor as a driving source, a cam for vertically driving the feed rod which is attached to a rotating shaft of the motor, and a feed cam for reciprocally moving the feed rod which is attached to the shaft. Upon rotation of the motor, the feed rod is vertically moved by the cam, so that the engaging portion of the feed rod engages with the lead frame. At the same time, the feed rod is moved along the guide path by means of the feed cam. Thus, the lead frame is intermittently conveyed at a selected pitch.

However, in the apparatus with the above structure, the following drawbacks are presented. The cam for vertically moving the feed rod and the feed cam for reciprocally moving the feed rod are driven by a single driving source, that is, the motor. The members of the driving means are located in one place. Thus, the driving means is complex and hence the apparatus as a whole is complex. Further, the feed cam must be replaced by another in order to change the feed pitch of the feed rod, inevitably because the feed cam converts the rotation of the motor shaft to a linear motion of the feed rod. It takes a long time to replace the feed cam with another.

SUMMARY OF THE INVENTION

The present invention has been made in consideration of the above drawbacks and has for its object to provide an apparatus for conveying a lead frame mounting semiconductor pellets which has a simple construction and can readily adjust the feed pitch.

According to one aspect of the present invention, there is provided an apparatus comprising: a guide path for guiding the lead frame; a feed member movably disposed between an initial position and a forward position along the guide path and movably disposed between a first position where the feed member is separated from the lead frame and a second position where the feed member engages with the lead frame; first driving means for moving the feed member from the first position to the second position; and second driving means, which is separate from the first driving means, for moving the feed member positioned in the second position from the initial position to the forward position, whereby the lead frame is conveyed along the guide path for a predetermined distance.

According to the apparatus, the first and second driving means for driving the feed member are separately arranged. Therefore, unlike the conventional apparatus, the members constituting the driving means need not be located in one place. Thus, the apparatus as a whole can be simplified. Further, a feed pitch of the feed member can be readily changed by adjusting only the second driving means.

BRIEF DESCRIPTION OF THE DRAWINGS

FIGS. 1 to 3 schematically show an apparatus according to an embodiment of the present invention, in which FIG. 1 is a plan view thereof, FIG. 2 is a front view thereof, and FIG. 3 is a sectional view taken along the line III—III in FIG. 2.

DETAILED DESCRIPTION OF THE PREFERRED EMBODIMENT

An apparatus for conveying lead frame mounting semiconductor pellets according to an embodiment of the present invention will be described with reference to the accompanying drawings.

Figure 1:
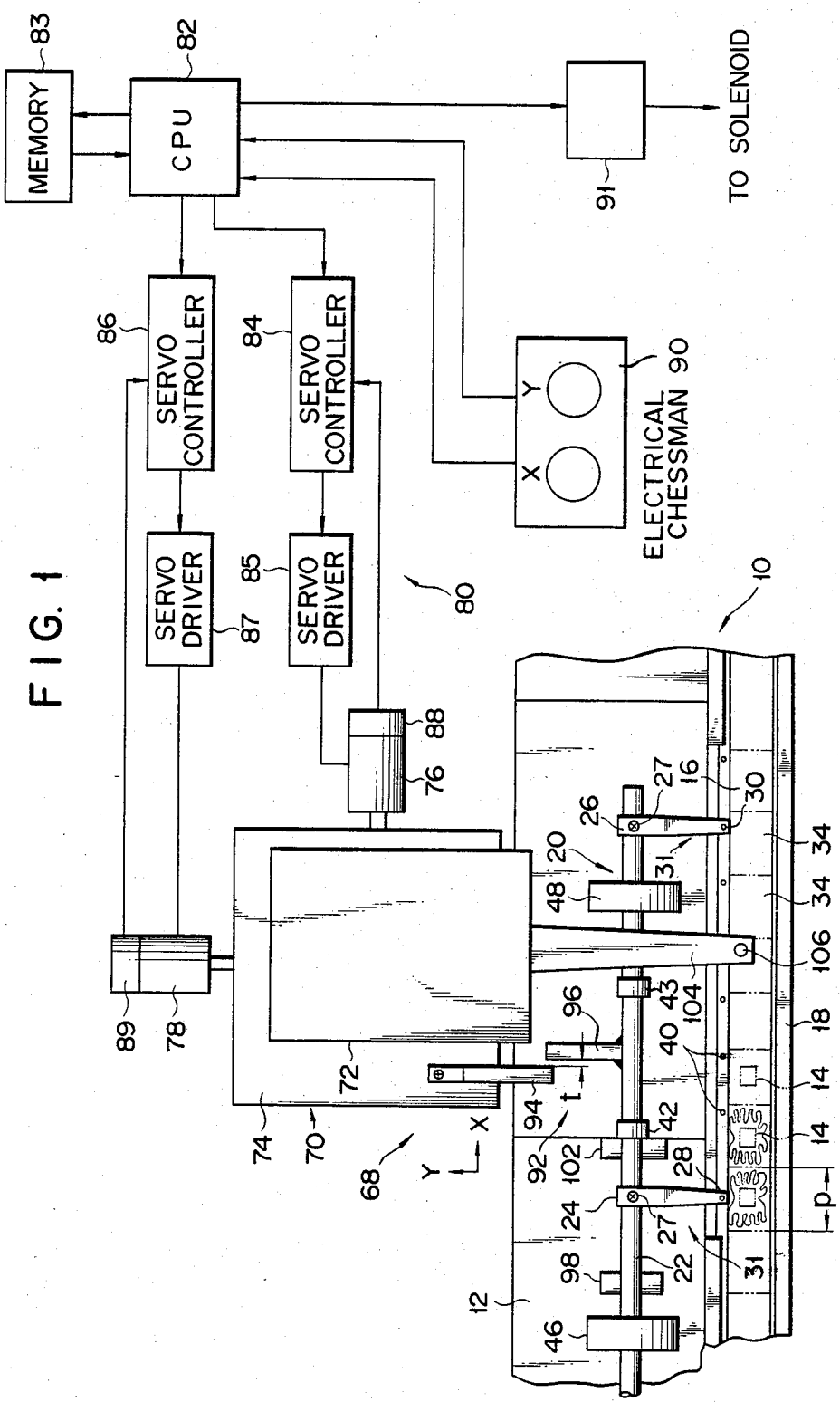
Figure 2:
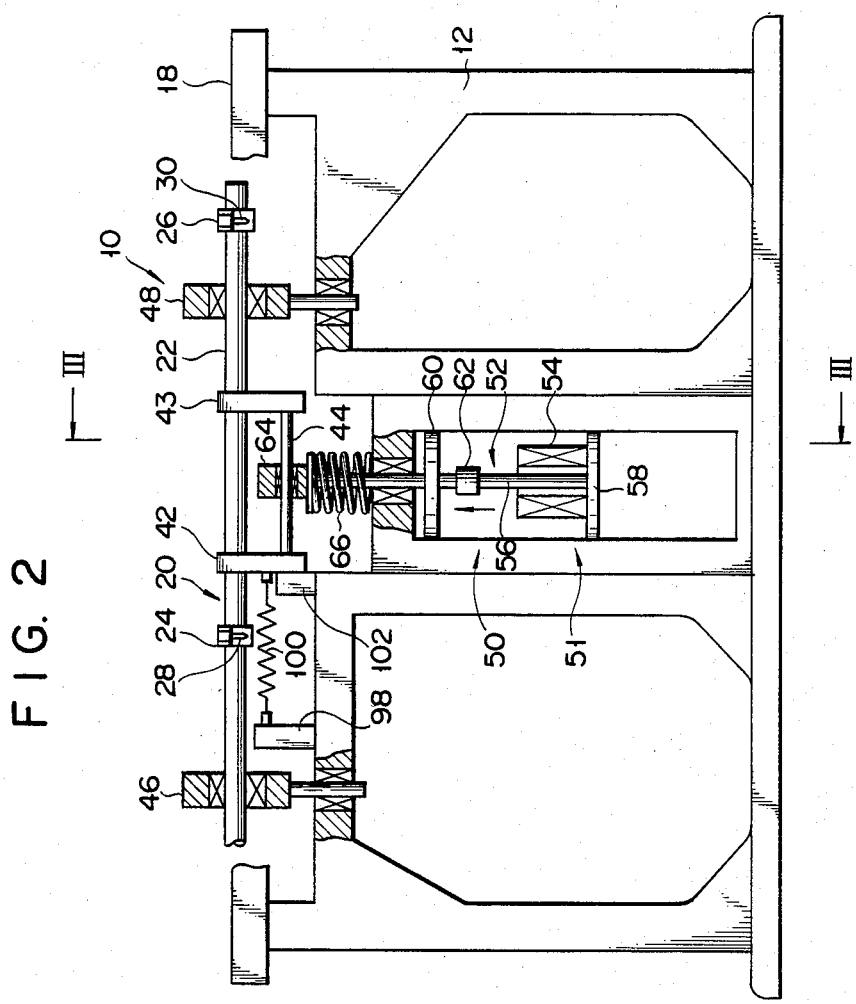
Figure 3:
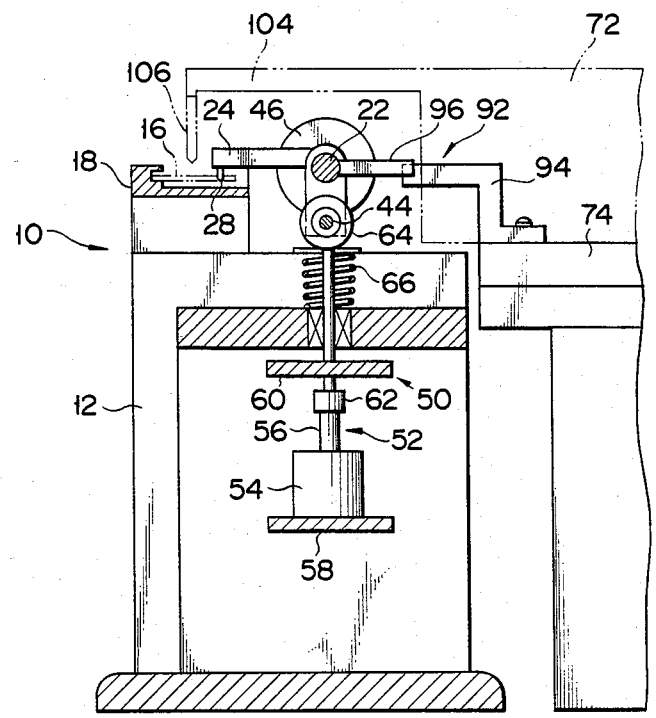
Figure 4:
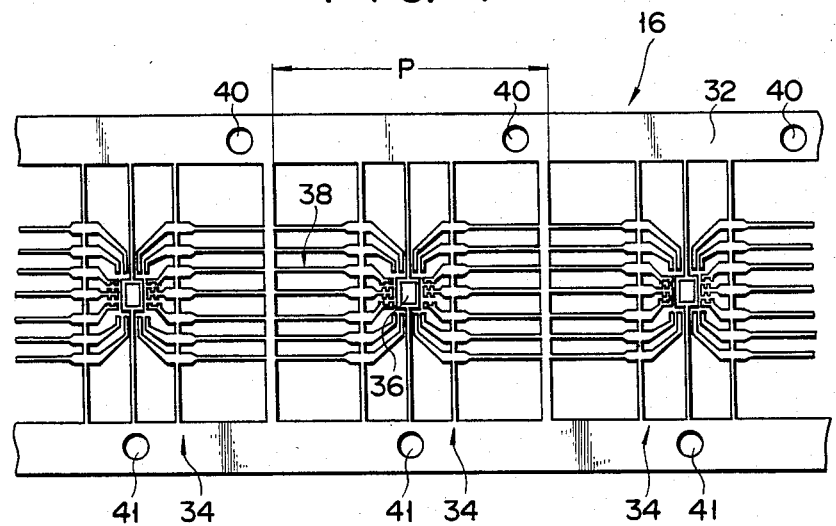
FIG. 4 is a plan view of a lead frame.

As shown in FIGS. 1 to 3, an apparatus 10 has a support frame 12 and a guide path 18 for guiding a lead frame 16, which mounts a number of semiconductor pellets 14 thereon, along the longitudinal direction of the lead frame. The guide path 18 is fixed on the support frame 12 and horizontally extends therealong. The apparatus 10 has a feed member 20 for intermittently conveying the lead frame 16 along the guide path 18. The feed member 20 has an elongated rod-shaped main body 22 which is arranged parallel to the guide path 18, that is, horizontal along the guide path 18, and a pair of engaging arms 24 and 26 vertically extending from the main body 22 toward the guide path 18. The engaging arms 24 and 26 are respectively mounted by, for example, screws 27 on the main body 22 to be horizontally movable with respect to the main body 22. The engaging arms 24 and 26 have engaging pins 28 and 30 respectively which extend from each extending end of the arms toward the lead frame 16 and can be engaged with the lead frame 16. The engaging arms 24 and 26 and the engaging pins 28 and 30 constitute an engaging portion 31 of the apparatus of the present invention. As shown in FIG. 4, the lead fame 16 has a plurality of units 34 which are continuously coupled by a frame main body 32. Each unit has a pellet mount portion 36, a lead portion 38 and so on. The frame main body 32 has a plurality of feed holes 40 and positioning holes 41 which are formed at equal intervals along the longitudinal direction of the lead frame 16, respectively. The engaging pins 28 and 30 are respectively inserted in the feed holes 40.

Referring to FIG. 2, the feed member 20 has a pair of connecting arms 42 and 43 which are fixed to the main body 22 and spaced apart from each other. Both arms 42 and 43 extend downward from the main body 22. The feed member 20 further has a connecting rod 44 which is disposed between the connecting arms 42 and 43 and which is parallel to the main body 22. The connecting arms 42 and 43 are disposed between the engaging arms 24 and 26. The main body 22 of the feed member 20 is movably supported along the longitudinal direction of the lead frame 16, that is, it is horizontally movable by means of a pair of bearings 46 and 48. As shown in FIG. 2, the bearings 46 and 48 are mounted on the support frame 12 to be vertically movable, respectively. Therefore, the feed member 20 is arranged to be vertically and horizontally movable.

The apparatus 10 has a first driving means 50 for vertically moving the feed member 20. As is apparent from FIG. 2, the first driving means 50 has a solenoid mechanism 52 as a first driving source 51. The solenoid mechanism 52 is mounted on the support frame 12. The solenoid mechanism 52 has a solenoid 54 and a plunger 56 which is vertically and linearly driven by the solenoid 54. The solenoid 54 is mounted on a support plate 58 fixed on the support frame 12. The upper end of the plunger 56 extends vertically upward through the support frame 12 and a support plate 60 fixed thereon. A stopper 62 is fixed at an intermediate portion of the plunger 56. The stopper 62 abuts against the support plate 60 to regulate the upward movement of the plunger 56. The lower end of the plunger 56 abuts against the support plate 58, so that the downward movement of the plunger 56 is regulated. A connecting body 64 is fixed to the upper end of the plunger 56. The connecting body 64 is connected to the connecting rod 44 of the feed member 20. The connecting rod 44 is horizontally movable with respect to the connecting body 64. Furthermore, a compression spring 66 is mounted around the plunger 56 between the connecting body 64 and the support frame 12. The plunger 56 is urged upward by the compression spring 66. When the solenoid 54 is powered, the plunger 56 is moved downward against the urging force of the compression spring 66 by the magnetic field generated by the solenoid 54, until the lower end of the plunger 56 abuts against the support plate 58. The plunger 56 causes the feed member 20 to vertically move from a first position (not shown) to a second position shown in FIGS. 2 and 3. In the second position, the engaging pins 28 and 30 of the feed member 20 are fitted in the feed holes 40 of the lead frame 16. However, when the solenoid 54 is de-energized, the plunger 56 is moved upward by the urging force of the compression spring 66 until the stopper 62 abuts against the supporting plate 60. The plunger 56 then causes the feed member 20 to move upward into the first position where the engaging pins 28 and 30 are separated from the feed holes 40. In this manner, the compression spring 66 constitutes a first restoring means for moving the feed member 20 from the second position back to the first position.

The apparatus 10 has a second driving means 68 for horizontally driving the feed member 20. As is apparent from FIG. 1, the second driving means 68 has a second driving source 70. In this embodiment, an X-Y table 74 on which a bonding head 72 is placed is used as the second driving source. The X-Y table 74 has an X-axis drive motor 76 for horizontally (along the X-axis) driving the X-Y table 74 and a Y-axis drive motor 78 for vertically (along the Y-axis) driving the X-Y table 74. Movement of the X-Y table 74 is controlled by a control device 80. The control device 80 has a CPU 82. The CPU 82 is connected to the X-axis drive motor 76 through a servo controller 84 and a servo driver 85 and to the Y-axis drive motor 78 through a servo controller 86 and a servo driver 87. The X- and Y-axis drive motors 76 and 78 respectively have encoders 88 and 89 which are respectively connected to the servo controllers 84 and 86. Further, an electrical chessman 90 which controls the displacement of the X-Y table 74, a control circuit 91 which controls power supply to the solenoid 54 (FIG. 2), and a memory 83 are connected to the CPU 82. The displacement of the X-Y table 74 is controlled by the control device 80 with high precision, only allowing an error of about ±2 μm.

As shown in FIGS. 1 and 3, the second driving means 68 has a transmitting means 92 for transmitting the driving force of the X-Y table 74 to the feed member 20. The transmitting means 92 has a driving side transmission arm 94 which vertically extends from the X-Y table 74 toward the feed member 20 and a driven side transmission arm 96 which vertically extends from the feed member 20 toward the X-Y table 74 in FIG. 1. These transmission arms 94 and 96 are disposed so that their extending ends horizontally overlap each other in FIG. 1 when the feed member 20 is moved into the second position. Only when the feed member 20 is located in the second position, does the transmitting means 92 transmit the driving force of the X-Y table 74 to the feed member 20. Further, as is apparent from FIG. 2, the second driving means 68 has a torsion spring 100 stretched between a projection 98 which extends from the support frame 12 and the connecting arm 42. The feed member 20 is urged to the left by the torsion spring 100 in FIG. 2. The feed member 20 is then kept in the initial position shown in FIGS. 1 and 2 where the connecting arm 42 abuts against a stopper 102 which extends from the support frame 12. When the X-axis drive motor 76 is driven by the control device 80, the X-Y table 74 is linearly and horizontally moved to the right in FIG. 1. The X-Y table 74 causes the feed member 20 to move by a predetermined distance from the initial position to the forward position (not shown) through the transmitting means 92 against the urging force of the torsion spring 100. The torsion spring 100 constitutes a second restoring means for moving the feed member 20 from the forward position back to the initial position.

In FIGS. 1 and 3, reference numerals 104 and 106 respectively denote a bonding tool and a capillary of the bonding head 72.

The mode of operation of the apparatus 10 with the above construction will be described hereinafter.

The lead frame 16 on which the semiconductor pellets 14 are placed is set in the guide path 18. The feed member 20 is set in the first position and in the initial position. Based on a command from the CPU 82, the control circuit 91 causes the solenoid 54 to turn on. The plunger 56 then causes the feed member 20 to move from the first position to the second position. The engaging pins 28 and 30 of the engaging arms 24 and 26 are respectively fitted into the feed holes 40. The driven side transmission arm 96 is moved to overlap the driving side transmission arm 94, so that the driving force of the X-Y table can be transmitted. In order to prevent collision of the driven side transmission arm 96 against the driving side transmission arm 94 upon movement of the driven side transmission arm 96, these arms are horizontally disposed to be spaced apart from each other by a clearance t (about 50 μm).

Based on a command from the CPU 82, the X-axis drive motor 76 is driven to move the X-Y table along the lead frame 16 by a predetermined distance. The predetermined distance is set to be the sum of a predetermined feeding pitch of the lead frame 16, that is, a frame pitch P and the clearance t. Upon movement of the X-Y table 74, the feed member 20 is moved to the forward position through the transmitting means 92. Furthermore, the lead frame 16 is conveyed by the feed member 20 by the frame pitch P along the guide path 18. When feeding of the lead frame 16 is completed, the solenoid 54 is de-energized on the basis of a command from the CPU 82. The feed member 20 is moved to the first position by the urging force of the compression spring 66. The engaging pins 28 and 30 are disengaged from the feed holes 40. At the same time, the driven side transmission arm 96 is vertically separated from the driving side transmission arm 94 in FIG. 3. The feed member 20 then returns to its initial position under the urging force of the torsion spring 100. Thereafter, predetermined bonding is performed by the bonding head 72.

The above operation is repeated, and the apparatus 10 intermittently conveys the lead frame 16 at the frame pitch P.

The lead frame 16 may be removed from the guide path 18 and another lead frame having a different pitch P may be set in the guide path. If this is the case, some of the members must be moved to different positions as will be described below.

The distance between the engaging pins 28 and 30 is adjusted in correspondence with the new lead frame in the following manner. The screws 27 for fastening the engaging arms 24 and 26 are loosened so as to render the engaging arms 24 and 26 movable relative to the main body 22. The feed member 20 is then moved into the second position. At the same time, the engaging arms 24 and 26 are positioned to engage the engaging pins 28 and 30 with the feed holes 40 of the lead frame 16. In this state, the engaging arms 28 and 30 are fixed on the main body 22 by the fastening screws 27. Thus, the adjustment of the distance between the engaging pins 28 and 30 is completed.

The frame pitch P of the lead frame is then adjusted in the following manner. The feed member 20 is located in the initial position where the connecting arm 42 abuts against the stopper 102. Upon operation of the electrical chessman 90, pulses for moving the X-Y table 74 along the X- and Y-axes are generated. The pulses are supplied to the X-Y table 74 through the CPU 82, the servo controllers 84 and 86, and the servo drivers 85 and 87. Thus, the X-Y table 74 is moved along the X- and Y-axes. The X-Y table 74 is moved into the start position (FIG. 1) where the driving side transmission arm 94 is spaced apart from the driven side transmission arm 96 by a distance corresponding to the clearance t. The operator presses a switch (not shown) to store data of the coordinates of the X-Y table in the start position in the memory 83. The lead frame is then moved such that the feed holes 40 thereof are located immediately under the engaging pins 28 and 30. Thereafter, the feed member 20 is moved into the second position and the engaging pins 28 and 30 are then fitted in the feed holes 40. An index (not shown) which is movably disposed in the guide path 18 is moved and is fixed in a position where the indicating pin indicates the center of one of the positioning holes. Upon operation of the electrical chessman 90, the X-Y table 74 is moved along the X-axis, that is, to the right in FIG. 1, so that the lead frame 16 is moved to the right via the feed member 20. The lead frame is conveyed forward until the index indicates the center of the next positioning hole. Thereafter, when the operator presses the switch (not shown) again, the data of the coordinates of the X-Y table in the end position is stored in the memory 83.

In this manner, the setting of the apparatus is completed. The electrical chessman which is generally incorporated in a conventional wire bonding apparatus is used. The adjustment of the feed amount is performed by alignment of the index with the hole of the lead frame. However, an ITV mounted on the wire bonding apparatus may also be used to set the feed amount with reference to one point of the lead frame.

As described in detail above, in the apparatus 10 of the present invention, the first and second driving means 50 and 68 which drive the feed member 20 have first and second driving sources 52 and 70 respectively and which are separated from each other. Therefore, unlike the conventional lead frame conveying apparatus, members which constitute the driving means need not be concentrated in one place. Thus, the overall structure of the apparatus is simplified. The first and second driving sources 52 and 70 provide linear drive. Unlike the conventional apparatus where rotational movement is converted to linear movement by means of a cam, no movement coverting member need be arranged, thus providing simpler construction. Furthermore, the adjustment of the feed pitch can be readily performed by adjusting only the linear stroke of the second driving source. Since no movement converting member need be used, a high precision of conveying of the lead frame can be maintained, whereas such precision is degraded in the conventional apparatus as the movement converting member such as a cam wears out.

In the above embodiment, the X-Y table 74 of the wire bonding apparatus is used as the second driving source 70. Therefore, a separate driving source need not be arranged, thus providing a simpler construction. At the same time, since the X-Y table is operated with high precision, the lead frame can be conveyed with high precision. The conventional apparatus requires about 0.7 seconds for a feed pitch of about 15 mm. However, the apparatus according to the present invention only requires about 0.4 seconds, resulting in high speed operation.

The feed member 20 is driven by the X-Y table 74 through the transmitting means 92. However, since the X-Y table does not engage with the feed member 20 at the time of bonding, the bonding operation is not adversely affected. Even if the X-Y table is not under control, the transmitting means 92 is operated intermittently, thus preventing damage to the feed member 20.

The present invention is not limited to the particular embodiment. For example, a solenoid mechanism may be used as the second driving source. Furthermore, the engaging portion of the feed member need not be limited to the engaging pins. A magnet or a clamp mechanism may also be used in place of the engaging pins.

What we claim is:

1. An apparatus for conveying a lead frame mounting semiconductor pellets comprising:
    a guide path for guiding the lead frame;
    a feed member movably disposed between an initial position and a forward position along the guide path and movably disposed between a first position where the feed member is separated from the lead frame and a second position where the feed member engages with the lead frame;
    first driving means for moving the feed member from the first position to the second position; and second driving means which is separate from the first driving means and includes an X-Y table for moving the feed member positioned in the second position from the initial position to the forward position, the X-Y table having a first drive motor for linearly driving the X-Y table along the guide path, whereby the lead frame is conveyed along the guide path by a predetermined distance.

2. An apparatus according to claim 1, wherein said X-Y table includes a second drive motor for linearly driving the X-Y table in a direction perpendicular to the guide path, and a bonding head thereon for bonding to the lead frame and pellet.

3. An apparatus according to claim 1, wherein said second driving means has transmitting means for transmitting a driving force of the second driving source to the feed member when the feed member is located in the second position.

4. An apparatus according to claim 3, wherein said transmitting means has a driving side transmission arm which extends from the second driving source toward the feed member and a driven side transmission arm which extends from the feed member toward the second driving source and which is engageable with the driving side transmission arm when the feed member is located in the second position.

5. An apparatus according to claim 1, wherein said feed member has an elongated main body disposed along the guide path, and an engaging portion being engageable with the lead frame and mounted on the main body to be movable along the longitudinal direction thereof.

6. An apparatus according to claim 5, wherein said engaging portion has an engaging arm mounted on the main body to be movable along the longitudinal direction thereof, and an engaging pin which extends from the engaging arm and which is inserted in one of feed holes of the lead frame when the feed member is located in the second position.

7. An apparatus according to claim 1, wherein said first driving means has first restoring means for moving the feed member from the second position to the first position.

8. An apparatus according to claim 1, wherein said second driving means has second restoring means for moving the feed member from the forward position to the initial position.

9. An apparatus according to claim 1, wherein said predetermined distance corresponds to a feed pitch of the lead frame.

10. An apparatus according to claim 1, wherein said second driving means includes a control device for controlling the movement of the X-Y table.

11. An apparatus according to claim 10, wherein said control device has a electrical chessman for teaching the movement of the X-Y table.

12. An apparatus according to claim 11, wherein said predetermined distance corresponds to a feed pitch of the lead frame, the feed pitch being adjusted by the electrical chessman.

13. An apparatus according to claim 1, wherein said first driving means includes a solenoid mechanism having a plunger which is driven linearly and directly connected to the feed member to move it.

14. An apparatus according to claim 10, wherein said control device includes encoders connected to the first and second drive motors.

* * * * *